United States Patent [19]

Nakamura et al.

[11] Patent Number: 4,949,455
[45] Date of Patent: Aug. 21, 1990

[54] I/O PIN AND METHOD FOR MAKING SAME

[75] Inventors: Keiichi Nakamura; Tsutomu Oshima, both of Tokyo; Noriharu Kurokawa, Surashi; Toshihiko Kitai, Isehara, all of Japan

[73] Assignee: AMP Incorporated, Harrisburg, Pa.

[21] Appl. No.: 305,312

[22] Filed: Feb. 1, 1989

[30] Foreign Application Priority Data

Feb. 27, 1988 [JP] Japan .................. 63-45427

[51] Int. Cl.⁵ .............. H01R 9/06; H01R 43/20; H05K 1/00
[52] U.S. Cl. ........................ 29/843; 439/65; 439/75; 439/91; 29/879; 204/15; 228/56.3; 228/160.2
[58] Field of Search ............... 29/840, 843, 877, 878, 29/879; 174/68.5; 228/180.2, 56.3; 439/91, 75, 65; 361/412, 414; 204/15

[56] References Cited

U.S. PATENT DOCUMENTS

| | | |
|---|---|---|
| 3,373,481 | 3/1968 | Lins et al. ............ 174/68.5 X |
| 3,525,666 | 8/1970 | Magee et al. ............ 439/75 |
| 3,569,607 | 3/1971 | Martyak et al. ............ 174/68.5 |
| 3,616,283 | 10/1971 | Magee et al. ............ 204/15 |
| 3,855,692 | 12/1979 | Dugan ............ 204/15 X |
| 4,003,621 | 1/1977 | Lamp ............ 439/91 |
| 4,135,988 | 1/1979 | Dugan et al. ............ 204/15 |
| 4,179,802 | 12/1979 | Joshi et al. . |
| 4,412,642 | 11/1983 | Fisher, Jr. . |
| 4,633,050 | 12/1986 | Samuels ............ 204/15 X |
| 4,642,889 | 2/1987 | Grabbe . |
| 4,661,887 | 4/1987 | Lin ............ 29/840 X |
| 4,664,309 | 5/1987 | Allen et al. . |
| 4,692,843 | 9/1987 | Matsumoto et al. ......... 228/180.2 X |
| 4,703,559 | 11/1987 | Ehrfeld et al. ............ 174/68.5 X |
| 4,705,205 | 11/1987 | Allen et al. . |
| 4,712,721 | 12/1987 | Noel et al. . |
| 4,788,767 | 12/1988 | Desai et al. ............ 29/840 X |

FOREIGN PATENT DOCUMENTS 1139612 1/1969 United Kingdom .................. 439/65

OTHER PUBLICATIONS

IBM Tech. Discl. Bull., vol. 20, No. 8, Jan. 1978, p. 2934 by Holmstrom.
IBM Tech. Discl. Bull., vol. 11, No. 12, May 1969, p. 1797 by R. A. Magee et al.
Use of Discrete Solder Columns to Mount LCCC's on Glass/Epoxy Printed Circuitboards-G. Cherian.
Solder Columns Secure Chip Carriers to Epoxy Electronics-Sep. 16, 1985.

Primary Examiner—Carl E. Hall
Assistant Examiner—Carl J. Arbes
Attorney, Agent, or Firm—Adrian J. LaRue

[57] ABSTRACT

An electrical pin comprises a metal pin having plated metal members at peripheral end surfaces thereof and head members including solder secured to the end surfaces of the metal pin and the plated metal members.

10 Claims, 3 Drawing Sheets

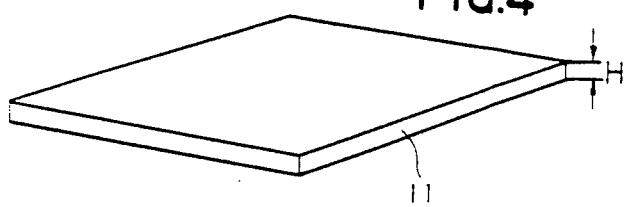
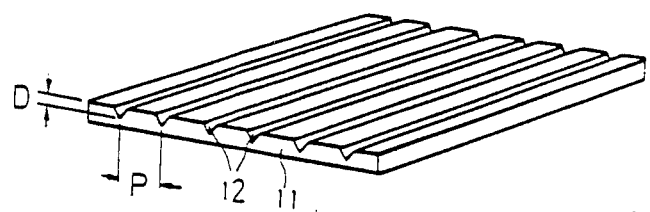
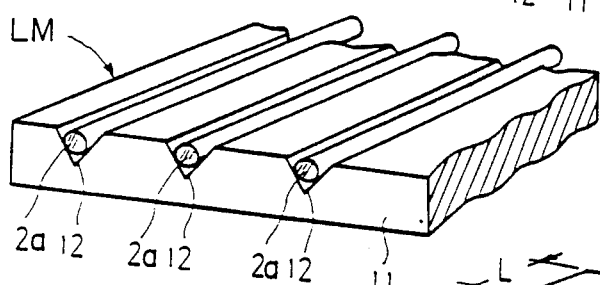
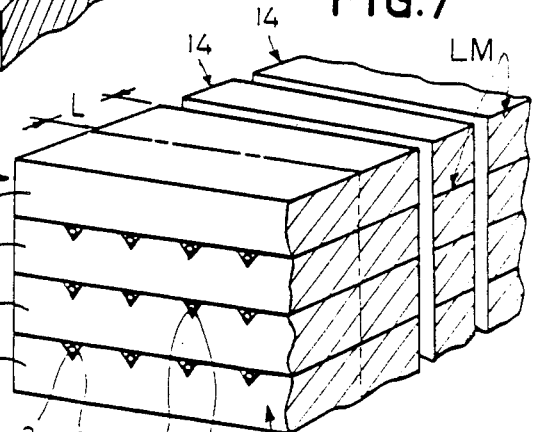
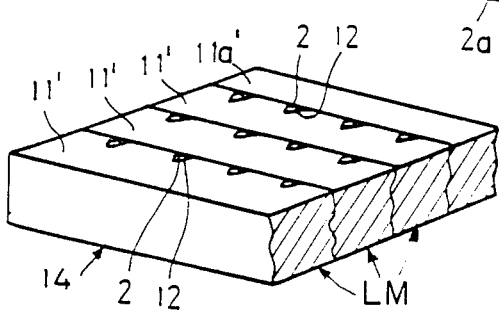

I/O PIN AND METHOD FOR MAKING SAME

FIELD OF THE INVENTION

This invention relates to a micro input/output pin and to a method for manufacturing the electrical pin. More particularly, the present invention is directed to a micro input/output electrical pin for electrically connecting the electrodes between an integrated circuit chip and a ceramic substrate and to a method for manufacturing the pin.

BACKGROUND OF THE INVENTION

Mounting a chip onto a ceramic substrate has traditionally involved arranging the chip at a prescribed position on the substrate, and using a wire-bonding device to connect wires from the chip electrodes to circuit paths on the substrate. Nevertheless, hybrid integrated circuit packages have been coming into greater use recently and the trend toward high-function and high-density circuits as well as lighter, thinner, shorter and smaller integrated circuit packages are being adapted to devices for everyday use. These devices are rapidly coming into common use; and, as a result an increasing demand is taking place for low-cost, lighter, thinner, shorter and smaller hybrid integrated circuit packages that make use of direct surface attaching of the chip to the ceramic substrate rather than the use of wire-bounding techniques.

A number of problems exist in conventional technology. In the case of using a wire-bonding device, very thin gold wires are extended between the electrodes of the ceramic substrate and the chip and soldered thereto. This resulted in low efficiency due to the processing operations and the area taken up by the electrodes on the chip and substrate was large. Moreover, the manufacturing was slow.

An effective method of overcoming these problems and satisfying the demands of meeting high production requirements for such low-cost, lighter, thinner, shorter and smaller hybrid integrated circuit packages is to directly solder the electrodes of the chip to the respective electrodes of the ceramic substrate.

SUMMARY OF THE INVENTION

The main objective of the present invention is the provision of ultra-small input/output electrical pins for directly connecting the electrodes of a chip and a ceramic substrate and a method for manufacturing or making the electrical pins thereby making use of the electrical pins to form lighter, thinner, shorter and smaller low-cost integrated circuit or hybrid integrated circuit packages at an increased manufacturing rate.

In order to achieve the above-stated objectives, the micro input/output electrical pins of this invention are each constructed of a conductive pin and conductive head members at each end of the conductive pin which are of larger diameter than that of the pin. The diameter of the pin is essentially the same along its length and each of the head members is made of a metal layer that is plated to the peripheral surface of the ends of pin and a layer of conductive metal including solder is secured to an end surface of the pin and the plated metal layer.

The method of manufacturing or making the micro input/output electrical pins comprises the steps of securing conductive-rods in grooves in a surface of a metal plate member at equal distances, securing a plurality of these metal plate members with rods therein and a metal plate member without rods together forming a stack, slicing the stack perpendicular to the rods at a prescribed length thereby forming a workpiece of metal plate member sections and pins, applying a photoresist material to the upper and lower surfaces of the workpiece, fixing areas of the photoresist over the ends of the conductive pins and between them while the areas of the photoresist around the pins are unfixed which are removed exposing the areas of the metal plate member sections thereunder, etching the exposed areas forming recesses and exposing peripheral ends of the pins, plating the recesses with a metal that also plates the peripheral ends of the pins, removing the fixed areas of the photoresist, applying a photoresist layer but leaving the end surfaces of the pins and plated metal exposed, plating another metal and solder layers onto the end surfaces of the pins and the plated metal, and etching the metal plate member sections until a thin portion thereof remains connecting the plated pins together as a group.

BRIEF DESCRIPTION OF THE DRAWINGS

The invention, together with objects and advantages thereof, is best understood by way of example with reference to the following attached detailed description in conjunction with the accompanying drawings.

FIGS. 4–16 are schematic explanatory diagrams showing the method of making the micro input/output pins with FIGS. 4–8 being perspective views of the steps involved in forming the workpiece and FIGS. 9–16 being cross-sectional views of the steps involved in forming the micro input/output pins from the workpiece of FIG. 8.

DETAILED DESCRIPTION OF THE INVENTION

Figure 1:
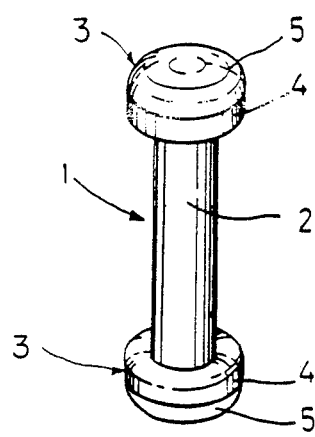
FIG. 1 is a perspective view of a micro input/output pin of this invention.
Figure 2:
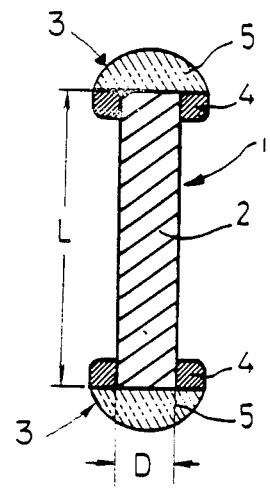
FIG. 2 is a vertical cross-sectional view of FIG. 1.

As shown in FIGS. 1 and 2, micro input/output electrical pin 1 includes a pin 2 of a suitable conductive metal of copper or an alloy thereof and metal head members 3 secured to each end of pin 2. Head members 3 have a larger diameter than pin 2. The length L of pin 2 is 0.6–0.9 mm and its diameter D is about 0.1 mm. Head members 3 constitute metal layer 4 that is plated to the peripheral surface of each end of pin 2 and solder layer 5 that completely covers the end surfaces of pin 2 and metal layers 4. Metal layer 4 is preferably copper and solder layer 5 is an alloy of gold and tin. The horizontal cross section of pin 2 and head members 3 are preferably round but can be of other shapes.

Figure 3:
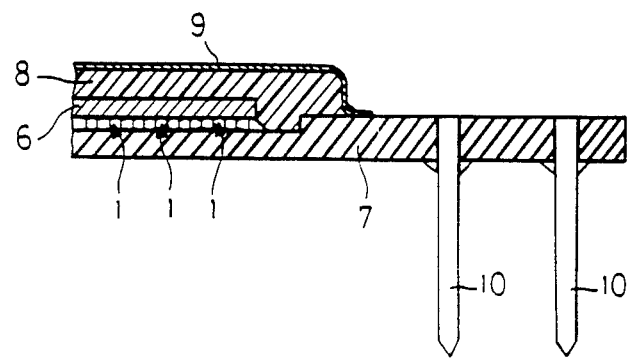
FIG. 3 is a part cross-sectional view of a hybrid integrated circuit package utilizing the micro input/output pins of the present invention.

FIG. 3 shows electrical pins 1, which are configured as shown in FIGS. 1 and 2, positioned between the electrodes of integrated circuit chip 6 and ceramic substrate 7. Heat and pressure cause the solder layers 5 to solder the respective electrodes to the pins 1 thereby directly electrically connecting the circuits of the chip 6 to respective conductive paths on the substrate 7. To complete the hybrid integrated circuit package of FIG. 3, a resin layer 8 is applied over chip 6 and substrate 7 adjacent thereto to seal the chip and a metal layer 9 is secured onto layer 8. Metal pins 10 are inserted into holes adjacent the outer ends of substrate 7 and soldered to metal pads of the circuit paths.

FIGS. 4-16 illustrate the various steps involved in manufacturing or making micro input/output electrical pins 1. A retaining metal plate member 11 of iron with a height H, as shown in FIG. 4, has V-shaped grooves 12 of a depth D formed in an upper surface at a specified pitch P. Height H, pitch P and depth D are the same in each plate member 11. Height H and pitch P are set at a prescribed pitch, e.g. approximately 0.6 mm, of the electrical pin 1, whereas the depth D is set at the diameter of the pin, e.g. approximately 0.1 mm. Furthermore, the pitch P is set to conform to the pitch of the electrodes of chip 6 and ceramic substrate 7.

In FIG. 6, a linear matrix LM of plate member 11 with metal rods 2a secured in equally-spaced grooves 12 via a conductive or insulating binder is shown.

Figure 9:
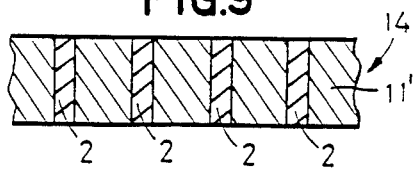
Figure 10:
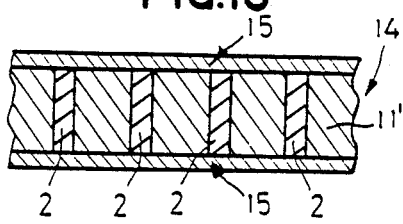

An appropriate number of linear matrixes LM are secured together in stacked relationship with a planar top plate 11a via a conductive or insulating binder as shown in FIG. 7 thereby forming a stacked structure 13. Thereafter, the stacked structure 13 is cut perpendicular to rods 2a and grooves 12 at lengths L whereby workpieces 14 are formed with a prescribed number of pins 2 in rows between metal plate sections 11' and 11' a as shown in FIGS. 8 and 9. The upper and lower surfaces of workpiece 14 are covered to a prescribed thickness with a layer 15 of conventional photoresist material.

Figure 11:
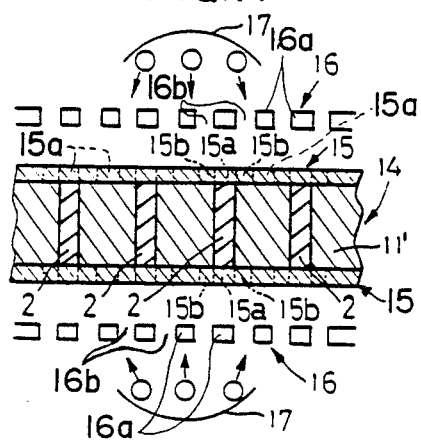
Figure 12:
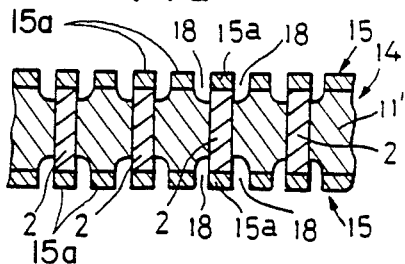
Figure 13:
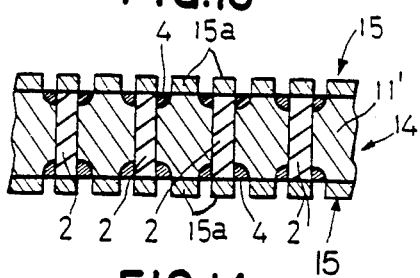
Figure 14:
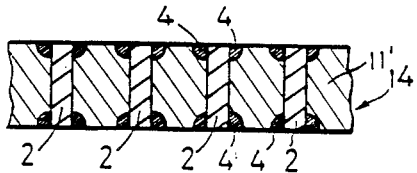

A mask 16, as shown in FIG. 11, is positioned outwardly from each layer 15 of photoresist material and it has light-transparent sections 16a positioned in alignment with pins 2 and therebetween and annular non-light-transparent sections 16b positioned in alignment with the annular areas surrounding pins 2. Light sources 17 transmit UV light through light-transparent sections 16a of masks 16 onto sections 15a of photoresist material and non-light-transparent sections 16b prevent the UV light from reaching sections 16b of layers 15. Sections 15a of layers 15 are thus activated by the UV light from light sources 17 thereby fixing these sections whereby subsections 15b are not activated by UV light and are removed by a conventional cleansing solution thereby exposing annular areas of plate 11 and leaving fixed sections 15a in position on workpiece 14. These exposed annular areas are subjected to an etching solution of ferrous chloride whereby electrolytic etching is performed thereby resulting in annular recesses 18 being formed in metal plate sections 11' as shown in FIG. 12, whereafter workpiece 14 is placed in a plating bath of copper causing recesses 18 and the peripheral end surfaces of pins 2 to be plated with copper forming copper plated layers 4 as shown in FIG. 13. Fixed photoresist sections 15a are then removed from workpiece 14 as shown in FIG. 14 so that the surfaces of workpiece 14 are exposed; whereafter, according to conventional practice which need not be shown, a layer of photoresist, as shown in FIGS. 10-13, is applied to the upper and lower surfaces of workpiece 14 with fixed areas and exposing the end surfaces of pins 2 and plated layers 4.

Figure 15:
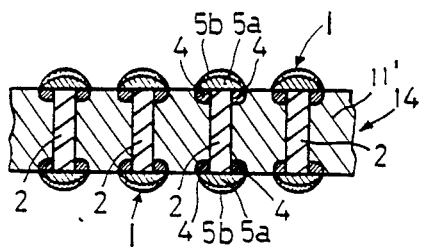
Figure 16:
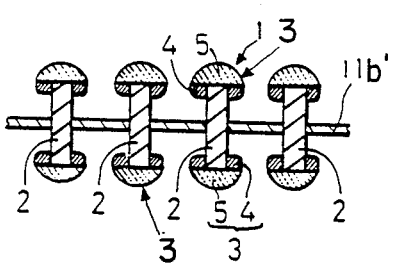

A precious metal layer 5a such as gold is then plated onto the end surfaces of pins 2 and plated metal layers 4, as shown in FIG. 15, whereafter, tin or other solder layer 5b is plated onto gold layer 5a thereby forming solder layers 5 of head members 3, as shown in FIG. 16. The head members 3 are alloyed in the presence of heat. The structure of head members 3 is about 80% gold and about 20% tin solder. Electrical pins 1 are therefore formed.

The photoresist layer is removed by conventional practice and workpiece 14 including electrical pins 1 of FIG. 15 is then immersed in a ferrous chloride etching solution with electrolytic etching of plate sections 11' taking place until only a thin portion 11'b thereof remains as shown in FIG. 16 which functions as a carrier member for electrical pins 1.

The group of electrical pins 1 of FIG. 16 can then be bonded via one of the head members 3 to an orientation member or alignment plate which is not susceptible to ferrous chloride etching solution whereafter this arrangement is placed in the etching solution and carrier member 11'b is etched away via electrolytic processing and the group of electrical pins 1 are retained in position on the orientation member or alignment plate which can then be packaged and shipped to customers for use thereby. Alternatively, the pins can be removed from the orientation member or alignment plate and secured onto a carrier member in spaced relationship corresponding to the distances between the electrodes of the chip carrier and the ceramic substrate and used in an automatic integrated circuit packaging assembly machine to directly connect the electrodes during the forming of the integrated circuit package of FIG. 3.

The micro input/output electrical pins of this invention enable direct connection of the integrated circuit chip in a monolithic integrated circuit or a hybrid integrated circuit of a chip carrier to a ceramic substrate. The electrical pins are very useful to make lighter, thinner, shorter, and smaller integrated circuit packages thereby reducing the production costs and upgrading the transmission speed of the integrated circuit. Furthermore, the solder layers, as part of the head members of the electrical pins, are located on the outer ends of the head members so that even if the diameter of the head members is about that of the pins, the solder layers will expand when heat and pressure are applied thereto thereby resulting in strong solder connections between the electrodes of the chip carrier and the ceramic substrate.

The method of manufacturing or making the electrical pins of the present invention enables a large number of electrical pins to be simultaneously produced. The masking, etching and plating technologies utilized in carrying out the method are conventional technologies well known in the field. Quality control of the making the electrical pins is easily effected thereby resulting in the production of quality electrical pins.

We claim:

1. A method of making electrical pins comprising the steps of:
   forming a matrix of a metal plate member and metal rods secured in longitudinally spaced grooves in a surface of the metal plate member;
   securing a plurality of said matrix together along with a planar metal plate member on the uppermost matrix thereby forming a stacked structure;
   cutting the stacked structure at a specified length and perpendicular to the direction of the metal rods thereby providing a workpiece of metal plate member sections and pins;
   placing photoresist layers on upper and lower surfaces of said workpiece;
   applying light through a mask onto the photoresist layers causing areas of the photoresist layers over the end surfaces of the pins and between the pins to be fixed while the areas of the photoresist layers surrounding the fixed areas over the end surfaces of the pins is unfixed;

removing the unfixed areas of the photoresist layers thereby exposing the areas of the metal plate member sections thereunder;

etching the exposed areas of the metal plate member sections thereby forming recesses and exposing peripheral surfaces at the ends of the pins;

plating the recesses and peripheral end surfaces of the pins with a metal layer;

removing the fixed areas of the photoresist layers from the workpiece;

applying a photoresist layer onto the upper and lower surfaces of the workpiece leaving the end surfaces of the pins and the plated metal layers exposed;

plating a solder layer onto the exposed end surfaces of the pins and plated metal layers thereby forming head members;

removing the photoresist layer from the workpiece surfaces; and etching the metal plate member sections until a thin section thereof remains thereby forming a carrier member with a group of electrical pins.

2. A method as claimed in claim 1 and including the further steps of:

adhering the head members of the electrical pins in the same plane to an orientation member;

and etching the remaining thin section of the metal plate member sections away leaving the electrical pins adhered to the orientation member.

3. A method as claimed in claim 2, and including the additional steps of:

removing the electrical pins from the orientation member; and securing the electrical pins onto a carrier member at a specified distance between the pins.

4. An electrical pin, comprising:

an elongate member having plated metal members secured to peripheral surfaces of the ends of the elongate member with the end surfaces of the elongate member being substantially coplanar with the respective end surfaces of the plated metal members; and head member of conductive metal including solder secured onto the end surfaces of said elongate member and said plated metal members, and an inner layer of a precious metal covered by the solder.

5. An electrical pin as claimed in claim 1, wherein said head members are solder alloy.

6. An electrical pin as claimed in claim 4, wherein the precious metal layer is gold.

7. An electrical pin comprising:

a straight, elongated electrically conductive pin member of substantially constant small diameter over the entire length;

plated metal members electrically plated over the outer peripheries of said electrically conductive pin member at and near both end portions thereof to a sufficient width and a thickness to substantially increase the outer diameter; and generally semi-spherical members made of low melting point electrically conductive material and, completely covering both end surfaces of said pin member and plated metal members;

wherein said plated metal members and generally semi-spherical members constitute a pair of integral metal head members of the electrical pin.

8. An electrical pin of claim 7, wherein said generally semi-spherical members are made of solder alloy.

9. An electrical pin of claim 7, wherein each of said generally semi-spherical members comprises a precious metal inner layer and a solder alloy outer layer.

10. An electrical pin comprising:

a pin member having plated metal members secured to peripheral surfaces of the ends of the pin member, the pin member having a first diameter, the end surfaces of the pin member being substantially coplanar with the respective end surfaces of the plated metal members;

head members of conductive metal including solder secured onto the end surfaces of the pin member, the head members having a second diameter, such that the second diameter is larger than the first diameter.

* * * * *

UNITED STATES PATENT OFFICE
CERTIFICATE OF CORRECTION

Patent No. 4,949,455          Dated August 21, 1990

Inventor(s) Keiichi Nakamura, Tsutomu Oshima, Noriharu Kurokawa, and Toshihiko Kitai It is certified that error appears in the above-identified patent and that said Letters Patent is hereby corrected as shown below:

Claim 5, Column 6, Line 6 - Replace the numeral "1" with the numeral --4--.

Signed and Sealed this

Twenty-eighth Day of April, 1992

*Attest:*

HARRY F. MANBECK, JR.

*Attesting Officer*          *Commissioner of Patents and Trademarks*